United States Patent [19]
Sato et al.

[11] 4,245,241

[45] Jan. 13, 1981

[54] SOLID-STATE COLOR IMAGING DEVICE

[75] Inventors: Kazuhiro Sato, Tokyo; Masuo Umemoto, Hinodemachi; Morishi Izumita, Inagi; Toshiyuki Akiyama, Kokubunji; Shusaku Nagahara, Hachioji, all of Japan

[73] Assignee: Hitachi, Ltd., Japan

[21] Appl. No.: 12,501

[22] Filed: Feb. 15, 1979

[30] Foreign Application Priority Data

Feb. 15, 1978 [JP] Japan ............................. 53-17161[U]
Jul. 7, 1978 [JP] Japan ............................. 53-92843[U]

[51] Int. Cl.$^3$ ............................................... H04N 9/07
[52] U.S. Cl. ...................................................... 358/44
[58] Field of Search ............................. 358/41, 43, 44

[56] References Cited
U.S. PATENT DOCUMENTS

| | | | |
|---|---|---|---|
| 4,042,956 | 8/1977 | Yamanaka | 358/41 |
| 4,054,906 | 10/1977 | Yamanaka | 358/43 |

*Primary Examiner*—Robert L. Richardson
*Attorney, Agent, or Firm*—Craig & Antonelli

[57] ABSTRACT

A solid-state color imaging device including a plurality of photosensors which are arrayed in the horizontal and vertical directions, and a mosaic color filter which is made up of filter elements arranged in correspondence with the respective photosensors. Any four adjacent filter elements of the mosaic color filter have different characteristics from one another with the first and second filter elements of the four adjacent filter elements being selected from the group consisting of first, second and third spectral region transmitting filters having different transmission characteristics, and the third and fourth filter elements of the four adjacent filter elements being complementary color filters of the respective first and second filter elements selected and being arranged adjacent the first and second filter elements, respectively, in the vertical direction.

25 Claims, 11 Drawing Figures

|  | m | m+1 | | | |
|---|---|---|---|---|---|
| n | R | Ye | R | Ye | R |
| n+1 | Cy | B | Cy | B | Cy |
| | R | Ye | R | Ye | R |
| | Cy | B | Cy | B | Cy |

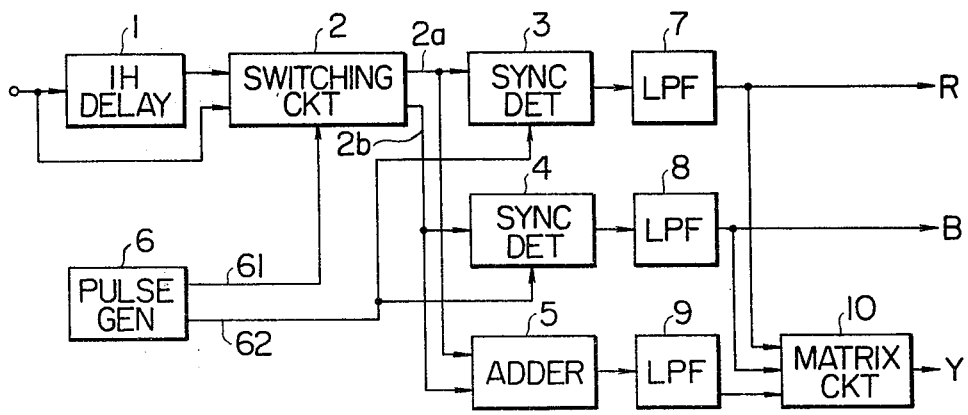

SOLID-STATE COLOR IMAGING DEVICE

BACKGROUND OF THE INVENTION

1. Field of the Invention

This invention relates to a solid-state color imaging device which employs a mosaic filter together with a solid-state imaging device having a plurality of photosensors arrayed in the form of a matrix.

2. Description of the Prior Art

In recent years, solid-state imaging devices employing CCDs (charge coupled devices) and MOSTs (metal oxide semiconductor transistors) have been vigorously developed. For example, the CCD type solid-state imaging device is disclosed in U.S. Pat. No. 3,801,884, and the solid-state imaging device employing MOSTs is disclosed in J. D. Plummer et al, "A Low-Light-Level Self-Scanned MOS Image Sensor", 1972, IEEE, International Solid-State Circuits Conference. It has also been attempted to put these solid-state imaging devices into color devices. For example, U.S. Pat. No. 3,971,065 may be referred to.

The solid-state color imaging devices hitherto proposed, however, have such various disadvantages that the utilization factor of light is inferior, that the resolution is low, that a moire pattern appears and that a signal processing circuit is complicated.

SUMMARY OF THE INVENTION

The present invention has as an object, the provisions of a solid-state color imaging device which has a high utilization factor of light and a high resolution.

According to this invention, in a solid-state color imaging device wherein a plurality of photosensors are arrayed in the horizontal and vertical directions and wherein filter elements of a mosaic color filter are arranged in correspondence with the respective photosensors, the filter elements corresponding to any four adjacent photosensors consist of first and second filters which are selected from among a first spectral region transmitting filter, a second spectral region transmitting filter and a third spectral region transmitting filter, respectively, having different transmission characteristics, and third and fourth filters which are complementary color filters to the first and second filters, respectively, with the first filter and the third filter being adjacent to one another in the vertical direction while the second filter and the fourth filter are adjacent to one another in the vertical direction.

The first spectral region transmitting filter, the second spectral region transmitting filter and the third spectral region transmitting filter are, for example, a red transmitting filter (R filter), a green transmitting filter (G filter) and a blue transmitting filter (B filter), and their complementary color filters are a cyan transmitting filter (Cy filter), a magenta transmitting filter (Mg filter) and a yellow transmitting filter (Ye filter), respectively.

In accordance with the structural arrangement of this invention, a (R+G+B) signal is always obtained by adding optical signals from the two photosensors adjacent each other in the vertical direction, that is, outputs of two horizontal lines adjacent each other. Thus, the resolutions of the brilliance component and the hue component can be enhanced. Among the four adjacent photosensors, the two corresponding filter elements are the complementary color filters, so that the light utilization factor is enhanced.

BRIEF DESCRIPTION OF THE DRAWINGS

FIG. 1 is a schematic plan view of a mosaic color filter which is employed in a prior-art solid-state color imaging device, FIGS. 2(a), 2(b) and 2(c) are schematic plan views each showing an embodiment of a mosaic color filter which is employed in a solid-state color imaging device of this invention, FIG. 3 is a block diagram of an embodiment of a signal processing circuit of the solid-state color imaging device which employs any of the mosaic color filters shown in FIGS. 2(a)–(c)

DESCRIPTION OF THE PREFERRED EMBODIMENTS

Figures 4, 5A, 5B, 5C:
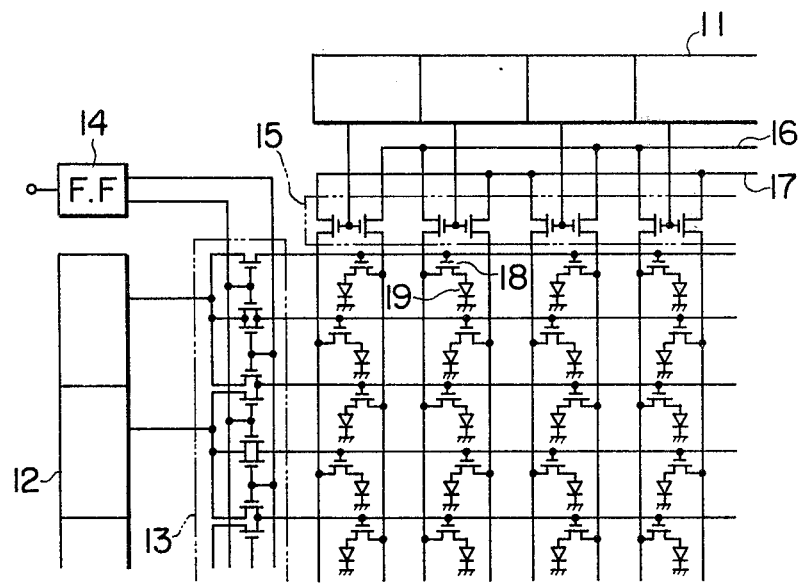
FIG. 4 is a circuit arrangement diagram showing an example of a solid-state imaging device which is suitable for this invention.
FIGS. 5(a), 5(b) and 5(c) are schematic plan views each showing another embodiment of the mosaic color filter which is employed in the solid-state color imaging device of this invention.

Before describing the embodiments of this invention in detail, an example of a solid-state color imaging device employing a prior-art mosaic color filter will be explained with reference to FIG. 1. The prior art is disclosed in U.S. Pat. No. 3,971,065. In the figure, a plan view of the mosaic color filter is shown in a model-like fashion. An area R, an area G and an area B in the figure indicate an R filter, a G filter and a B filter, respectively. All these filter elements are arrayed at one-to-one correspondence with the respective photosensors which are arrayed in the horizontal and vertical directions.

The feature of the illustrated mosaic color filter is that the G filters exist at every other sensor position in both the horizontal and vertical directions and that the R filters and the B filters exist in every other line alternately with the G filters. According to this construction, the photosensors which receive luminance components exist at every other sensor position in both the horizontal and vertical directions, so that an image sampling in which luminance signals predominate in both the horizontal and vertical directions can be achieved.

In the solid-state imaging device employing this mosaic color filter, however, the filter elements arranged in correspondence with the respective photosensors are the R filters, G filters and B filters, so that the utilization factor of light is inferior. That is, the R filter, G filter and B filter can send only about ⅓ of the total light component to the corresponding photosensors, respectively. Moreover, since the resolutions of an R signal and B signal are inferior, the resolutions of a hue signal and a luminance signal are low.

Hereunder, this invention will be described in detail in connection with several embodiments.

Each of FIGS. 2(a)–2(c) shows a first embodiment of this invention. The figures show the plan constructions of mosaic color filters for a solid-state color imaging device according to this invention wherein an area Cy, an area Mg and an area Ye indicate a Cy filter, an Mg filter and a Ye filter, respectively. In FIG. 2(a), the R filter and the B filter are selected as first and second filters of four adjacent filters and the Ye filter are selected as third and fourth filters being complementary color filters, respectively.

In FIG. 2(b), the B and G filters and their complementary color filters are selected. In FIG. 2(c), the G and R filters and their complementary color filters are selected.

The Cy signal=(B+G) signal, the Mg signal=(R+B) signal, and the Ye signal=(R+G) signal. In the case of FIG. 2(a), therefore, the R signal and the (R+G) signal are obtained from the n-th horizontal line, and the (G+B) signal and the B signal from the (n+1)-th horizontal line. As shown in FIG. 3, accordingly, an output of the imaging device is separated into the respective signals of the n-th and (n+1)-th horizontal lines by the use of a one horizontal scanning period-delay circuit 1 and a signal switching circuit 2. As a result, the R signal and the (R+G) signal are provided at an output 2a of the signal switching circuit 2, and the (G+B) signal and the B signal are provided at an output 2b thereof. The output signals 2a and 2b are synchronously detected by synchronous detector circuits 3 and 4 and then passed through low-pass filters (LPF) 7 and 8, respectively, whereby the R signal and the B signal of base bands can be obtained.

On the other hand, when the signals of the n-th row and (n+1)-th row are added by an adder circuit 5, the sum signal of two photosensors adjacent in the vertical direction becomes an (R+G+B) signal at all times. By employing this signal as a luminance signal, a picture of good resolution can be reproduced.

Numeral 6 designates a pulse generator circuit, which provides a pulse train 62 for the synchronous detection and a pulse train 61 for the signal switching. Since the aforecited luminance signal (R+B+G) differs in the mixing ratio of the R, G and B signals from the luminance signal specified in the NTSC color television format, the signal may provide a cause of luminance distortion. Accordingly, a correction of the signal (R+B+G) can be obtained by mixing low frequency components (below 500 KHz) of the R and B signals by means of a matrix circuit 10.

In a solid-state imaging device wherein the number of picture elements in the vertical direction is approximately 250, the signals of the n-th row and the (n+1)-th row must be separated by the one horizontal scanning period-delay circuit 1 as illustrated in FIG. 3. However, in an imaging device as shown by way of example in FIG. 4, wherein the number of vertical picture elements is approximately 500 and wherein signals of two horizontal lines can be read simultaneously and derived to individual output lines, the one horizontal scanning period-delay circuit 1 and the signal switching circuit 2 in FIG. 3 are unnecessary.

The constructional arrangement of FIG. 4 will now be briefly explained. Horizontal read switches 15 and vertical read switches 18 are respectively turned "on" and "off" by output pulses of a horizontal scanning circuit 11 and a vertical scanning circuit 12. At that time, the vertical scanning pulses have the combination of horizontal lines for simultaneous selection altered every field by means of an interlace switching circuit 13 and a flip-flop circuit 14 being a control circuit therefor. Numeral 19 indicates a photosensor such as photodiode.

Signals of the photosensors in the odd and even horizontal lines can be obtained at output lines 16 and 17 at the same time. These signals are directly applied to the synchronous detector circuits 3 and 4 and the adder circuit 5 in FIG. 3. The circuits of FIGS. 3 and 4 are also applicable to the filter arrangements of FIGS. 2(b) and 2(c).

According to the circuit shown in FIG. 3, the (R+G+B) signal which is employed as the luminance signal is obtained by the adder 5. In order to obtain the G signal alone, by way of example, the signals of the output lines 16 and 17 are respectively passed through band-pass filters (BPF), the resultant signals are subjected to a subtraction, and the difference signal is detected. The filtering and the subtraction may be inverted. In this case, one band-pass filter suffices. As an alternative method, signals with the outputs of the output lines 16 and 17 delayed by a period of time corresponding to one photosensor and the undelayed output signals are respectively subjected to subtractions, and the differences may be added after synchronously detecting them. The two signals respectively obtained by the subtractions may be subjected to a subtraction, whereupon the difference may be synchronously detected.

The R signal may be obtained in such a way that a signal obtained by passing the aforecited G signal through a low-pass filter is subtracted from a signal obtained by passing the signal of the output line 16 through a low-pass filter, or that the aforecited G signal is subtracted from the signal of the output line 16. The R signal is also obtainable in such a way that a signal with the output signal of the output line 16 delayed by a period of time corresponding to one photosensor and the undelayed signal are subjected to a subtraction, whereupon the difference is synchronously detected. By similarly processing the signal of the output line 17, the B signal can be obtained.

Each of FIGS. 5(a)-5(c) shows a second embodiment of this invention. In the present embodiment, the first filter and the second filter of four adjacent filter elements are adjacent one another in the horizontal direction, and the third filter and the fourth filter are adjacent one another in the horizontal direction.

In FIG. 5(a), the R filter and the B filter lie on an identical horizontal line. In FIG. 5(b), the B filter and the G filter lie on an identical horizontal line, and in FIG. 5(c), the G filter and the R filter lie thereon. Also with the present embodiment, when signals of the n-th and (n+1)-th horizontal lines are added, the sum signal of two adjacent photosensors in the vertical direction becomes the (R+G+B) signal at all times. By employing this signal as a luminance signal, a picture of good resolution can be reproduced.

Especially in the mosaic color filter of FIG. 5(c), the G signal components exist every other photosensor in both the horizontal and vertical directions, and also the R signal components exist ever other photosensor in both the horizontal and vertical directions, so that the occurrence of the moire pattern diminishes.

Figure 6:
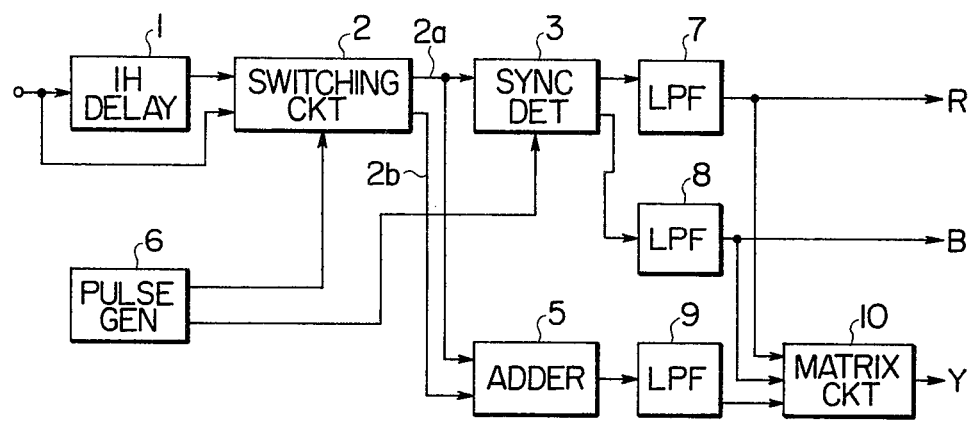
FIG. 6 is a block diagram showing an embodiment of a signal processing circuit of the solid-state color imaging device which employs any of the mosaic color filters shown in FIGS. 5(a)–5(c)

FIG. 6 shows an example of a signal processing circuit of a solid-state color imaging device which employs the mosaic color filter in FIG. 5(a). Numeral 1 designates a one horizontal scanning period-delay circuit, numeral 2 a signal switching circuit, numeral 3 a synchronous detector, numeral 5 an adder, and numeral 6 a pulse generator circuit. Numerals 7, 8 and 9 indicate low-pass filters (LPF) and numeral 10 indicates a matrix circuit. In the circuit arrangement, the R signal and the B signal are alternately provided at an output 2a of the signal switching circuit 2, and the (G+B) signal and the (R+G) signal are alternately provided at an output 2b. Therefore, signals obtained by synchronously detecting the signals at the output 2a by means of the synchronous detector 3 and then passing the detected signals through the low-pass filters 7 and 8 become the R signal, and the B signal respectively. Also, in the present embodiment, an output from the adder 5 is the (R+G+B) signal. This signal may be passed through the low-pass filter 9 to derive only a base-band signal, and it may be used as a luminance signal.

Also in the present embodiment, the one horizontal scanning period-delay circuit 1 and the signal switching circuit 2 can be omitted when the solid-state imaging device of FIG. 4 is used. This circuit of FIG. 6 is also applicable when employing the mosaic color filters in FIGS. 5(b) and 5(c).

The circuit of FIG. 6 may be modified, for example, such that the separation of the G signal is conducted in such a way that signals with the signals of the output lines 16 and 17 delayed by a period of time corresponding to one photosensor and the undelayed signals of the output lines 16 and 17 are respectively subjected to subtractions, whereupon the two subtraction results are added.

In the mosaic color filter arrangement of FIG. 5(a), the R component and the B component are carrier waves whose frequencies are equal and whose phases differ 180° from each other. For the separation between the R signal and the B signal, therefore, the following measure is considered in addition to the embodiment shown in FIG. 6. The R signal or the B signal is also obtained by passing the signals of the output lines 16 and 17 through band-pass filters, respectively, synchronously detecting them by means of synchronous detectors and adding both the signals. Further, the R signal or the B signal can be obtained in such a way that signals with the signals of the output lines 16 and 17 passed through band-pass filters, respectively, are subjected to a subtraction, whereupon the difference is passed through a synchronous detector.

Figure 7:
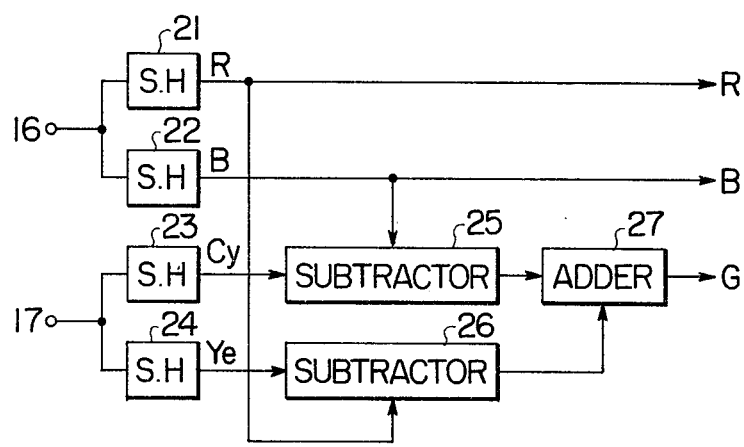
FIG. 7 is a block diagram showing a modified embodiment of the signal processing circuit shown in FIG. 6.

In the case of making any of the mosaic color filters in FIGS. 2(a)–2(c) and 5(a)–5(c) integral with the solid-state imaging device in FIG. 4, signals of the photosensors corresponding to the R filter, the B filter, the Ye filter and the Cy filter are sampled and held and are thereafter subjected to operations, whereby the signals R, G and B can be obtained. FIG. 7 illustrates this example as to a case of employing the mosaic color filter in FIG. 5(a). In the figure, numerals 21, 22, 23 and 24 indicate sample and hold circuits (S. H), numerals 25 and 26 indicate subtractors, and numeral 27 indicates an adder. In the present embodiment, the R, B and G signals are operated on the basis of the R, B, Cy and Ye signals and then delivered as outputs.

We claim:

1. In a solid-state color imaging device including a plurality of photosensors arrayed in horizontal and vertical directions, and a mosaic color filter formed of a plurality of filter elements arranged in correspondence with the respective photosensors, and means for sequentially reading out image signals from the photosensors and providing at least one output indicative thereof, the improvement wherein any four adjacent filter elements of the plurality of filter elements forming the mosaic color filter have different characteristics from one another, a first and second filter element of the four adjacent filter elements being selected from the group consisting of a first spectral region transmitting filter, a second spectral region transmitting filter, and a third spectral region transmitting filter, each of the first, second and third spectral region transmitting filters having different transmission characteristics and a third and fourth filter element of the four adjacent filter elements being complementary color filters of the respective first and second filter elements selected, the first and third filter elements being adjacent to one another in the vertical direction and the second and fourth filter elements being adjacent to one another in the vertical direction.

2. A solid-state color imaging device according to claim 1, wherein the first spectral region transmitting filter the second spectral region transmitting filter, and the third spectral region transmitting filter are respectively a red transmitting filter, a green transmitting filter, and blue transmitting filter.

3. A solid-state color imaging device according to one of claims 1 or 2, wherein the first and second filter elements are adjacent to one another in the horizontal direction.

4. A solid-state color imaging device according to claim 3, further comprising signal processing means for processing the output of the reading out means and providing at least two color signals.

5. A solid-state color imaging device according to claim 4, wherein the signal processing means further provides one of a luminance signal and another color signal.

6. A solid-state color imaging device according to one of claims 1 or 2, wherein the first and fourth filter elements are adjacent to one another in the horizontal direction.

7. A solid-state color imaging device according to claim 6, further comprising signal processing means for processing the output of the reading out means and providing at least two color signals.

8. A solid-state color imaging device according to claim 7, wherein the signal processing means further provides one of a luminance signal and another color signal.

9. A solid-state color imaging device according to one of claims 1 or 2, further comprising signal processing means for processing the output of the reading out means and providing at least two color signals.

10. A solid-state color imaging device according to claim 9, wherein the signal processing means further provides one of a luminance signal and another color signal.

11. A solid-state imaging device according to claim 10, wherein the signal processing means includes delay means for delaying the output of the reading out means, one horizontal scanning period and providing a delayed output, switching means for receiving the delayed output and the output of the reading out means for providing respective outpus indicative of the image signals in two adjacent horizontal lines, and detector means for detecting at least one of the respective outputs of the switching means for providing two color signals.

12. A solid-state imaging device according to claim 11, wherein the detector means includes at least one synchronous detector and low-pass filter means.

13. A solid-state imaging device according to claim 12, wherein the signal processing means further includes adding means for adding the respective outputs of the switching means.

14. A solid-state imaging device according to claim 13, wherein the signal processing means includes matrix circuit means for mixing outputs of the low-pass filter means with an output of the adding means.

15. A solid-state color imaging device according to claim 10, wherein the reading out means simultaneously reads out image signals from the photosensors arranged in two adjacent horizontal lines and provides respective outputs indicative thereof.

16. A solid-state color imaging device according to claim 9, wherein the reading out means simultaneously reads out image signals from the photosensors arranged in two adjacent horizontal lines and provides respective outputs indicative thereof.

17. A solid-state imaging device according to claim 16, wherein the signal processing means includes adding means for adding the respective outputs of the reading out means.

18. A solid-state imaging device according to claim 17, wherein the signal processing means includes detector means and low-pass filter means for processing the respective outputs of the reading out means to provide the two color signals.

19. A solid-state imaging device according to claim 16, wherein the first and second filter elements are the red transmitting filter and the green transmitting filter, respectively, and the third and fourth filter elements are a cyan transmitting filter and a magenta transmitting filter, respectively, the first and second filter elements being adjacent to one another in the horizontal direction.

20. A solid-state imaging device according to claim 16, wherein the signal processing means includes sample and hold circuit means for receiving the respective outputs of the reading out means.

21. A solid-state imaging device according to claim 20, wherein the sample and hold circuit means includes first and second sample and hold circuits arranged for receiving one of the respective outputs of the reading out means and each providing a color signal output, and third and fourth sample and hold circuits for receiving the other of the respective outputs of the reading out means and each providing an output, the signal processing means further including first and second subtractor means for subtracting the outputs of the first and fourth sample and hold circuits and the outputs of the second and third sample and hold circuits, and adder means for adding the outputs of the first and second subtractor means.

22. A solid-state color imaging device comprising:
a plurality of photosensors arrayed in horizontal and vertical directions;
a mosaic color filter positioned on said correspondence with said respective photosensors, said mosaic color filter comprising a plurality of filter elements, any four adjacent filter elements of which have different characteristics to each other, the first and the second filter elements of said four adjacent filter elements being selected from the group consisting of first, second and third spectral region transmitting filters, each of which has different transmission characteristics, the third and the fourth filter elements of said four adjacent filter elements being complementary color filters of said respective first and second filter elements, said respective first and third filter elements and said respective second and fourth filter elements being arranged adjacent to one another in the vertical direction;
scanning means including switching means, coupled to a plurality of said photosensors through said switching means, for scanning said photosensors in order to read out signals from said respective photosensors; and
output means coupled to a plurality of said photosensors, for outputing color imaging signals.

23. A solid-state color imaging device according to claim 22, wherein said scanning means comprises horizontal scanning means and vertical scanning means, said horizontal scanning means including first switching means, coupled to said photosensors therethrough, said vertical scanning means including second switching means coupled to said photosensors therethrough.

24. A solid-state color imaging device according to claim 23, wherein said vertical scanning means is arranged so that said second switching means is simultaneously actuated at two adjacent horizontal scanning lines.

25. A solid-state color imaging device according to claim 24, further comprising means for scanning a different pair of said horizontal scanning lines at different fields, coupled to said vertical scanning means.

* * * * *